(12) United States Patent
Kinoshita et al.

(10) Patent No.: US 6,854,078 B2
(45) Date of Patent: Feb. 8, 2005

(54) MULTI-BIT TEST CIRCUIT

(75) Inventors: Mitsuya Kinoshita, Hyogo (JP); Katsumi Dosaka, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 452 days.

(21) Appl. No.: 09/987,563

(22) Filed: Nov. 15, 2001

(65) Prior Publication Data

US 2002/0129308 A1 Sep. 12, 2002

(30) Foreign Application Priority Data

Mar. 5, 2001 (JP) ........................................ 2001-060152

(51) Int. Cl.[7] .............................................. G11C 29/00
(52) U.S. Cl. ........................ 714/718; 714/48; 365/201
(58) Field of Search .......................... 714/48, 709, 718, 714/732, 736, 819; 365/201, 189.01

(56) References Cited

U.S. PATENT DOCUMENTS 5,311,473 A * 5/1994 McClure et al. ............ 365/201
5,579,272 A * 11/1996 Uchida ........................ 365/201
5,706,234 A * 1/1998 Pilch et al. .................. 365/201
5,838,627 A * 11/1998 Tomishima et al. ..... 365/230.03
6,421,794 B1 * 7/2002 Chen et al. .................... 714/42
6,484,289 B1 * 11/2002 Hsu ............................. 714/820

FOREIGN PATENT DOCUMENTS

JP           5-211000         8/1993
JP           9-185899         7/1997

* cited by examiner

Primary Examiner—Guy J. Lamarre
Assistant Examiner—John Trimmings
(74) Attorney, Agent, or Firm—McDermott Will & Emery LLP

(57) ABSTRACT

Internal read out data bits are divided into a plurality of data groups, and data bits in corresponding positions in different data groups are paired off. A determination gate is provided to each pair of data bits, and determining operation is performed in each pair to compress the result of determination to finally generate a 1-bit flag indicating a match/mismatch in logic level among the internal read out data. Consequently, a multi-bit test circuit that has a reduced layout area and can perform high-speed multi-bit determination is provided.

9 Claims, 7 Drawing Sheets

F I G. 5
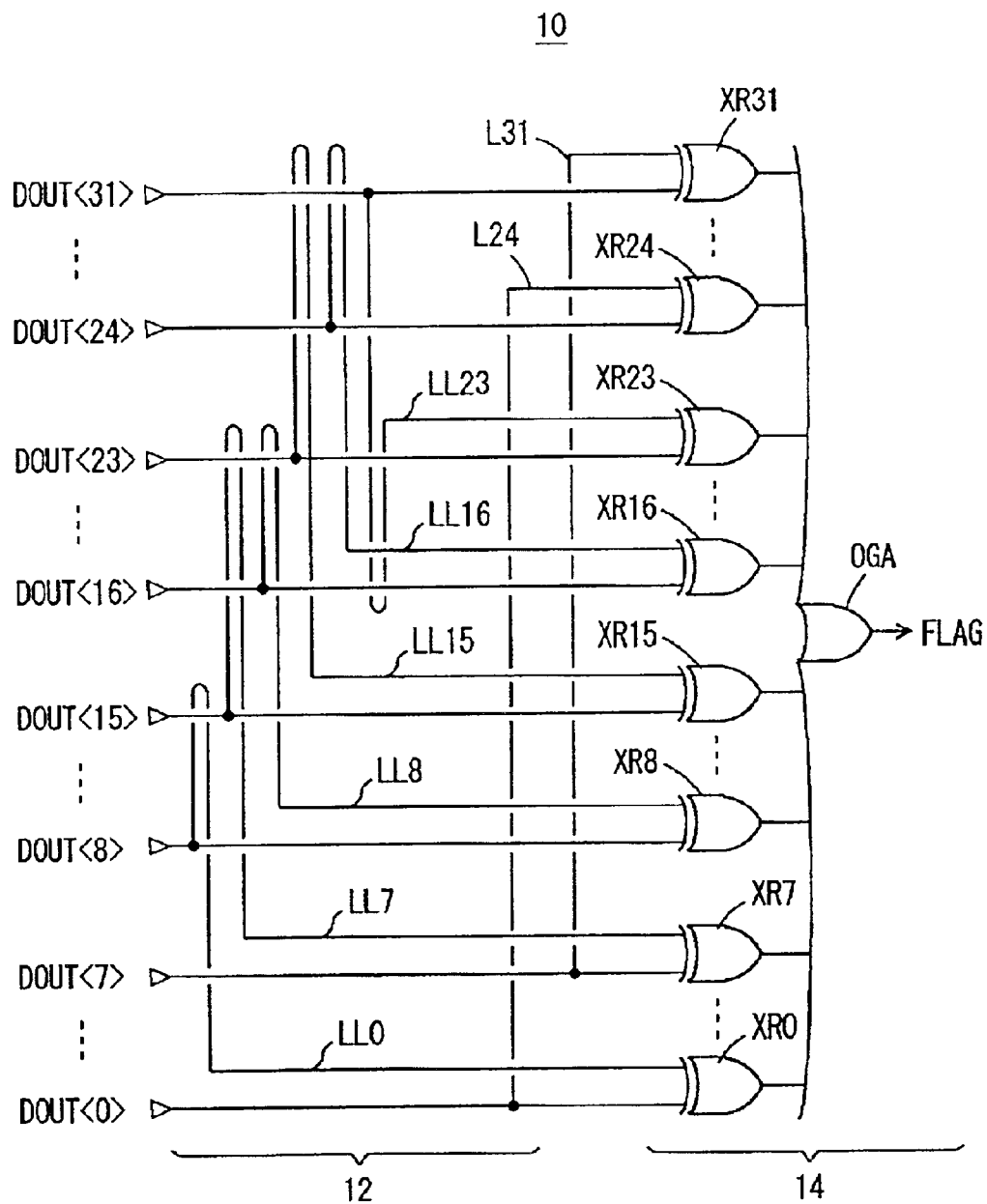

MULTI-BIT TEST CIRCUIT

BACKGROUND OF THE INVENTION

1. Field of the Invention

The present invention relates to a multi-bit test circuit for carrying out tests on a plurality of memory cells at the same time, and more specifically, to a multi-bit test circuit for determining a match or a mismatch in logical level among the data bits read out in parallel from the plurality of memory cells.

2. Description of the Background Art

One of the tests applied to a semiconductor memory device is a checking of seeing if data can be written to and read from memory cells correctly. In this checking, test data having a predetermined bit pattern are written in memory cells, then read therefrom, and then it is determined whether the read out data are matched with expected value data. When the readout data match the expected data, the semiconductor memory device is considered to operate properly, and on the other hand, when they mismatch each other, the semiconductor memory device is considered to contain a bit defect.

It would take too much time to execute this checking test on a semiconductor memory device with a large storage capacity on a bit by bit basis. In order to reduce the testing time, the test is executed in units of plural bits by utilizing a multi-bit test method. In the multi-bit test, multi-bit memory cells are selected concurrently, and test data bits of the same logical level are written to these memory cells. Then, stored data are read concurrently from these memory cells for determination of a match or a mismatch in logical level among the readout data bits.

In this multi-bit test, multi-bit memory cells are generally tested at the same time, which can reduce the test time as compared with the case where the readout data bits are checked on matching with the expected value data on a bit by bit basis. When the bit width is 256 bits as in an embedded DRAM (dynamic random access memory) and is larger than a standard DRAM, compression of the internal readout data of such large data bit width makes it possible to perform the test at higher speed with the use of a testing apparatus for the standard DRAM.

FIG. 8 shows an example of the structure of a conventional multi-bit test circuit. In this structure, 32-bit data D<0>–D<31> read out in parallel from a memory circuit MK are compressed to generate a 1-bit flag FLAG finally. The flag FLAG indicates a match or a mismatch in logical level among 32-bit data D<31:0>.

In FIG. 8, the multi-bit test circuit includes a buffer circuit BF for amplifying a specific data bit D<31>; EXOR circuits EX0–EX30 arranged corresponding to data bits D<30:0>, respectively, for receiving the data bits at their respective first inputs and also receiving the output signal of buffer circuit BF at their second inputs; and an OR circuit GT for receiving the output signals of EXOR circuits EX0–EX30 to generate the flag FLAG.

Each of EXOR circuits EX0–EX30 operates as a mismatch detection circuit and outputs a high level signal when the signals received to the first and second inputs thereof are different in logical level from each other. In the multi-bit test circuit shown in FIG. 8, a data bit D<31> is used as a teacher data, and it is determined whether the logical levels of each of data bits D<30:0> and the teacher data match or mismatch each other. When specific data bit D<30:0> is equal in logical level to all of data bits D<30>–D<0>, EXOR circuits EX0–EX30 all output low level signals, which makes flag FLAG from OR circuit GT go low. This low level of the flag FLAG indicates that all the memory cell data read out in parallel are equal in logical level, and it is determined that data writing and reading are properly performed in memory circuit MK.

When at least one of readout data bits D<30:0> is different in logical level from data bit D<31>, at least one of EXOR circuits EX0–EX30 outputs a high level signal, which makes flag FLAG from OR circuit GT go high. This high level of the FLAG indicates a mismatch in logical level among the memory cell data, thereby detecting the presence of a bit failure.

In this multi-bit test, before the memory cell data are read out, data of the same logical level are written in the corresponding memory cells in memory circuit MK. Therefore, in the structure shown in FIG. 8, it is possible to determine whether proper data writing and reading are done to the 32-bit memory cells concurrently, which greatly reduces the test time as compared with the case where the test is done bit by bit.

In the multi-bit test circuit shown in FIG. 8, specific memory cell data (data bit D<31>) read out inside is used as a teacher data, and it is determined whether data bits D<30:0> are properly read out or not. The use of specific data bit D<31> as the teacher data causes the gate load and interconnection line load of the teacher data to be large. Thus, buffer circuit BF is used to transfer data bit D<31> to EXOR circuits EX30–EX0 arranged corresponding to data bits D<30:0>. In order to transfer data bit D<31> commonly to EXOR circuits EX30–EX0, buffer circuit BF must have a comparatively large driving capability, thereby requiring a large chip area. This causes a problem that a large chip area is needed for the multi-bit test circuit.

The output signal line of buffer circuit BF is connected to all of EXOR circuits EX30–EX0, with a long interconnection length and a large interconnection line load. This interconnection of the teacher data causes another problem that the propagation delay of the output signal of buffer circuit BF may delay the defining timing, to make it unable to drive flag FLAG to the definite state condition quickly. In order to avoid this problem, buffer circuit BF must have a larger driving power, causing further problem of occupying even larger chip area.

SUMMARY OF THE INVENTION

An object of the present invention is to provide a multi-bit test circuit that occupies a small chip area.

Another object of the present invention is to provide a multi-bit test circuit that can perform determining operations at a faster timing with reduced interconnection line length of teacher data.

Further another object of the present invention is to provide a multi-bit test circuit which can reduce the driven load by teacher data.

The multi-bit test circuit according to the first aspect of the present invention includes: a plurality of first determining circuits, arranged corresponding to a plurality of data bits read out in parallel from the memory array, each for determining a match or a mismatch in logical level between a corresponding data bit and a teacher data bit that is in a predetermined relation with the corresponding data bit; and a final determining circuit for outputting a final determination signal indicating a match or a mismatch in logical level among the plurality of data bits in accordance with the output signals of the plurality of first determining circuits. In the data bit pairs applied to the plurality of first determining circuits, different pairs include different teacher data bits.

The multi-bit test circuit according to another aspect of the present invention includes a plurality of data lines for selecting a plurality of data bits. The plurality of data bits are divided into 3 or more groups having the same bit width.

The multi-bit test circuit according to this aspect further includes: a plurality of determination gates, arranged corresponding to the plurality of data lines, each receiving, as teacher data, a data bit in a different group from the corresponding group to determine a match or a mismatch in logical level between the data bit of the corresponding data line and the received teacher data; and a final determination circuit for generating a final signal indicating a match or a mismatch in logical level in accordance with the output signals of the plurality of determination gates.

Applying a plurality of data bit pairs containing different teacher data from each other to the first determining circuits eliminates the need of applying 1-bit specific teacher data to the remaining bits, thereby reducing the load of teacher data. Hence, it becomes unnecessary to provide a buffer for driving teacher data, so as to reduce the layout area of the multi-bit test circuit.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 5 is a diagram showing the structure of a multi-bit test circuit according to a fifth embodiment of the present invention;

DESCRIPTION OF THE PREFERRED EMBODIMENTS

First Embodiment

Figure 1:
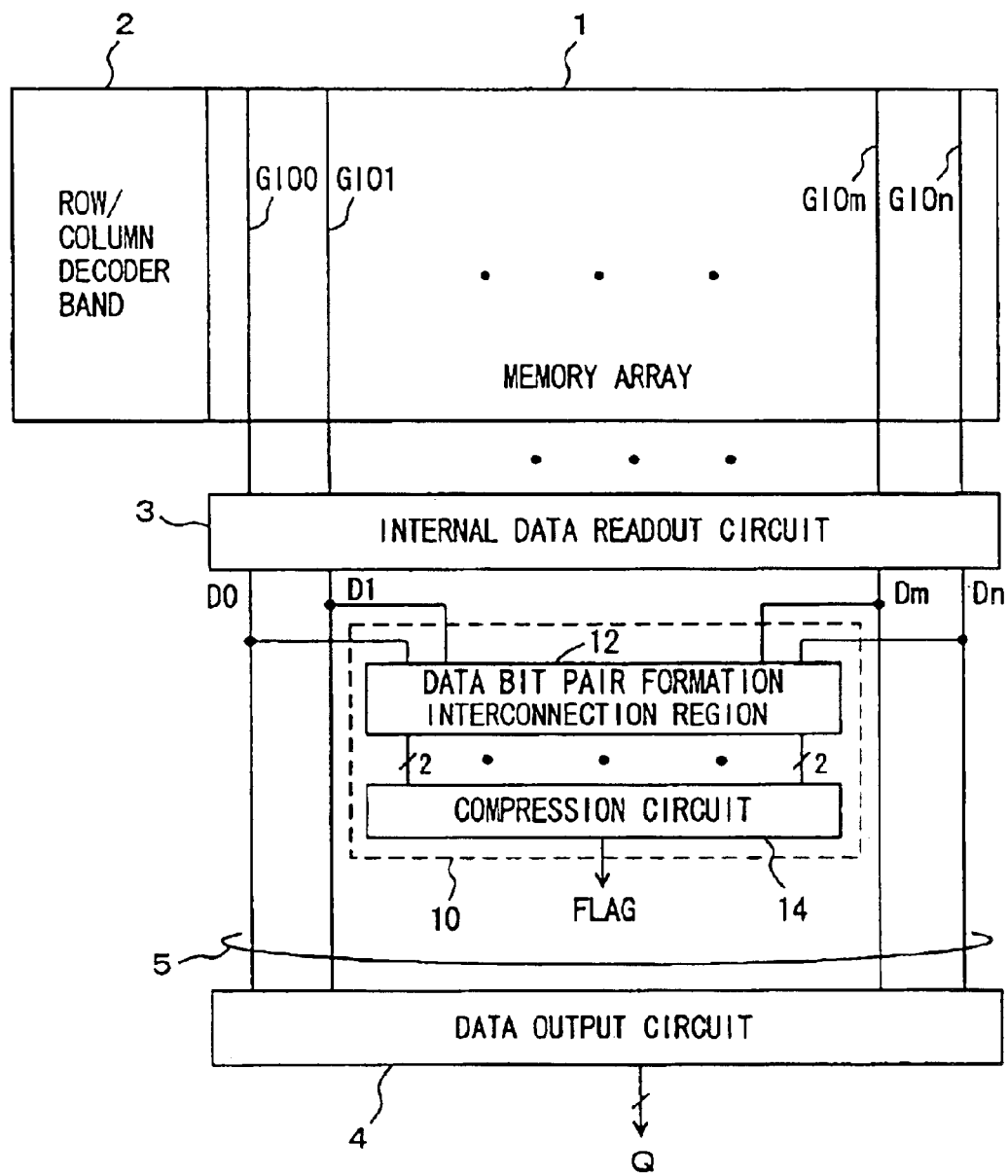
FIG. 1 is a diagram schematically showing the structure of a main part of the semiconductor memory device according to the present invention.

FIG. 1 is a diagram schematically showing the structure of a main part of the semiconductor memory device according to the present invention. In FIG. 1, the semiconductor memory device includes a memory array 1 having a plurality of memory cells arranged in rows and columns, and a row/column decoder band 2 for selecting a row of and a column of the memory cells in memory array 1. In row/column decoder band 2, row decoders for selecting a memory cell row in memory array 1, and column decoders for selecting a memory cell column in memory array 1 are placed in alignment with each other. In memory array 1, word lines arranged corresponding to the memory cell rows, and column selecting lines transmitting a column selection signal for selecting a memory cell column are arranged along the direction of rows.

Over memory array 1, global data line pairs GIO0–GIOn are arranged to transmit internal data.

The selected columns of memory array 1 are connected to these global data line pairs GIO0–GIOn.

The semiconductor memory device further includes an internal data readout circuit 3 for generating internal readout data by amplifying the memory cell data read out on global data line pairs GIO0–GIOn, a data output circuit 4 for buffering and externally outputting readout data bits D0–Dn generated by internal data readout circuit 3, and a multi-bit test circuit 10 for receiving readout data bits D0–Dn on readout data bus 5 in parallel and determining a match or a mismatch in logical level among readout data bits D0–Dn.

Internal data readout circuit 3 includes a preamplifier circuit to amplify the memory cell data bits read out on global data line pairs CIO0–GIOn, thereby generating (n+1)-bit internal readout data.

Multi-bit test circuit 10 includes a data bit pair formation interconnection region 12 where data bit pairs are formed from readout data bits D0–Dn generated by internal data readout circuit 3 by making interconnection in accordance with a predetermined relation for the read out data bits, and a compression circuit 14 for compressing the read out data bits with each data bit pair formed by data bit pair formation interconnection region 12 used as a unit, so as to finally generate 1-bit flag FLAG.

Compression circuit 14 includes determination gates for determining whether the corresponding data bit pairs are the same in logical level or not, and a final determination circuit for determining a match or a mismatch in logical level among all bits D0–Dn.

This flag FLAG, which indicates the test result from multi-bit test circuit 10, may be outputted externally either via a specific output circuit (output buffer circuit) of data output circuit 4, or via a specific pad (or a pin terminal).

In multi-bit test circuit 10 shown in FIG. 1, the provision of data bit pair formation interconnection region 12 for forming pairs of internal readout data bits D0–Dn read out from internal data readout circuit 3 makes it possible to allocate different teacher data bits to the readout data bits. This eliminates the need of making comparison for the read out data bits using a specific data bit as teacher data to determine the matching with all the remaining bits, and also eliminates the need of transmitting a specific teacher data bit over a long distance. Consequently, unlike the conventional device, there is no need to use buffer circuit BF in order to transmit the teacher data bit, which results in a decrease in the layout area of multi-bit test circuit 10. Moreover, different readout data bit pairs have different teacher data bits, so that determination operation of matching/mismatching of logic level can be performed using each readout data bit as teacher data. This can reduce the interconnection load of the teacher data and decrease the propagation delay of the teacher data, thereby achieving high-speed determining operation.

As described above, according to the first embodiment of the present invention, readout data bits D0–Dn read out from internal data readout circuit 3 including the preamplifier circuit are classified into pairs so as for different pairs to include different teacher data bits. This eliminates the need of transmitting the teacher data over a long distance, which makes the buffer circuit transmitting the teacher data unnecessary, thereby reducing the chip area for the test circuit. The data bit pairs have different teacher data bits from each other, thereby reducing the interconnection length and gate loads of the teacher data, so as to achieve high-speed transmission of the teacher data.

Second Embodiment

Figure 2:
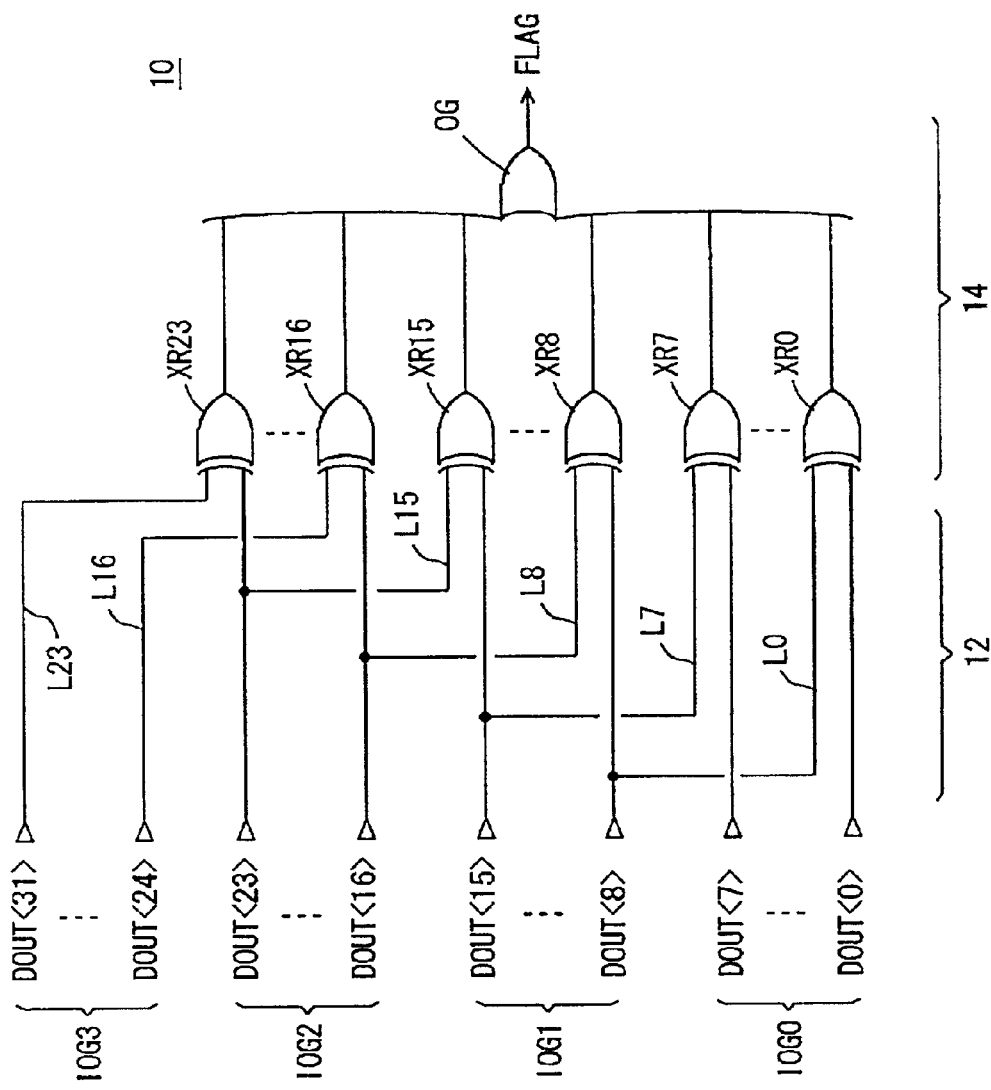
FIG. 2 is a diagram showing the structure of a multi-bit test circuit according to a second embodiment of the present invention.

FIG. 2 shows the structure of multi-bit test circuit 10 according to the second embodiment of the present invention. Multi-bit test circuit 10 shown in FIG. 2 handles 32-bit readout data DOUT<0>–DOUT<31>. These readout data bits DOUT<31:0> correspond to data bits D0–Dn or a part of them shown in FIG. 1.

Data DOUT<0>–DOUT<31> are divided into four data groups IOG0–IOG3 each having 8-bit data. In data bit pair formation interconnection region 12 of multi-bit test circuit 10, internal interconnection lines L0–L23 are so arranged that data bits in the same positions in adjacent data groups make pairs. For example, as shown in FIG. 2, internal interconnection line L0 is so arranged that data bit DOUT<0> having the smallest number in data group IOG0 is paired up with readout data bit DOUT<8> having the smallest number in adjacent data group IOG1. Internal interconnection line L7 pairs up internal readout data bit DOUT<7> with readout data bit DOUT<15> in adjacent data group IOG1.

In data group IOG1, internal interconnection lines L8–L15 are so arranged that readout data bits DOUT<8>–DOUT<15> are paired up with data bits DOUT<16>–DOUT<23> in the corresponding positions in adjacent data group IOG2, respectively.

In data group IOG2 internal interconnection lines 23 are so arranged that readout data bits DOUT<16>–DOUT<23> are paired up with readout data bits DOUT<24>–DOUT<31> in the corresponding positions in adjacent data group IOG3, respectively.

Thus, for data bits DOUT<23:0>, a match or a mismatch in logical level is determined by using, as the teacher data, the data bits in the corresponding positions in the respective adjacent data groups.

Compression circuit 14 includes EXOR circuits XR0–XR23 arranged corresponding to data bits DOUT<0>–DOUT<23>, respectively, and an OR circuit OG for receiving the output signals of EXOR circuits XR0–XR23 to generate 1-bit flag FLAG. EXOR circuits XR0–XR23 receive the data bits in the corresponding positions in the adjacent data groups at their respective second inputs via internal interconnection lines L0–L23. Data bits DOUT<24>–DOUT<31> in data group IOG3 are used as the teacher data for data bits DOUT<16>–DOUT<23> in adjacent data group IOG2, and no EXOR circuit is provided for data bits DOUT<31:24> in data group IOG3.

When readout data bits DOUT<31:0> all have the same logical level or when data bits DOUT<23:0> have the same logical levels as their respective teacher data bits DOUT<31:8>, EXOR circuits XR0–XR23 all output low level signals, and responsively, flag FLAG from OR circuit OG goes low. On the other hand, when at least one of readout data bits DOUT<31:0> differs in logical level from the remaining data bits or when at least one of data bits DOUT<23:0> does not match the corresponding one of teacher data bits DOUT<31:8>, the corresponding EXOR circuit outputs a high level signal, and the 1-bit flag FLAG from OR circuit OG responsively goes high.

Thus, the use of the corresponding data bits in the adjacent data groups as teacher data makes it possible to determine a match or a mismatch in logical level among readout data bits DOUT<31:0> in the same manner as in the conventional device.

Figure 8:
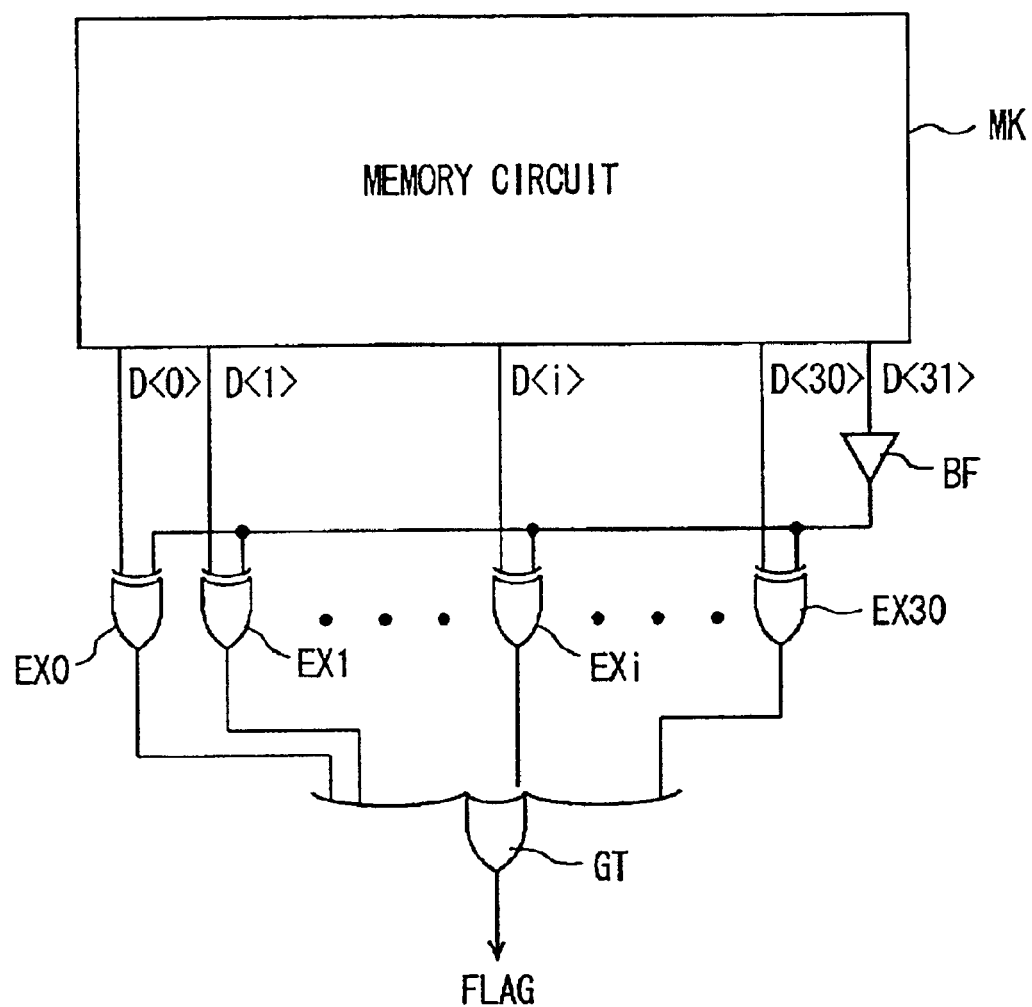
FIG. 8 is a diagram showing the structure of a conventional multi-bit test circuit.

In the structure shown in FIG. 2, each bit of data bits DOUT<7:0> and DOUT<31:24> is only required to drive the input load (gate load) of one EXOR circuit, whereas each bit of readout data bits DOUT<23:8> is only required to drive the input load of two EXOR circuits. Therefore, unlike the conventional device where a specific data bit is used as a common teacher data signal, there is no need to drive the input loads of all the EXOR circuits for the remaining data bits in accordance with the specific data bit. This can minimize the driving loads of the readout data, so as to make it unnecessary to provide conventional buffer circuit BF as shown in FIG. 8, thereby reducing the chip layout area of multi-bit test circuit 10.

The use of the data bits in the corresponding positions in the adjacent data groups as teacher data achieves high-speed transmission of the teacher data due to the small interconnection lengths, and also allows internal interconnection lines L0–L23 to be approximately equal in length. This can reduce signal propagation delay and advances the defining timing of the signals in EXOR circuits XR0–XR23, thereby driving 1-bit flag FLAG into a definite state at a faster timing through high-speed compression operation. It also becomes possible to write and read a different 8-bit data pattern in each data group, so as to make the contents of the multi-bit test flexible, thereby improving the reliability of the multi-bit test.

Third Embodiment

Figure 3:
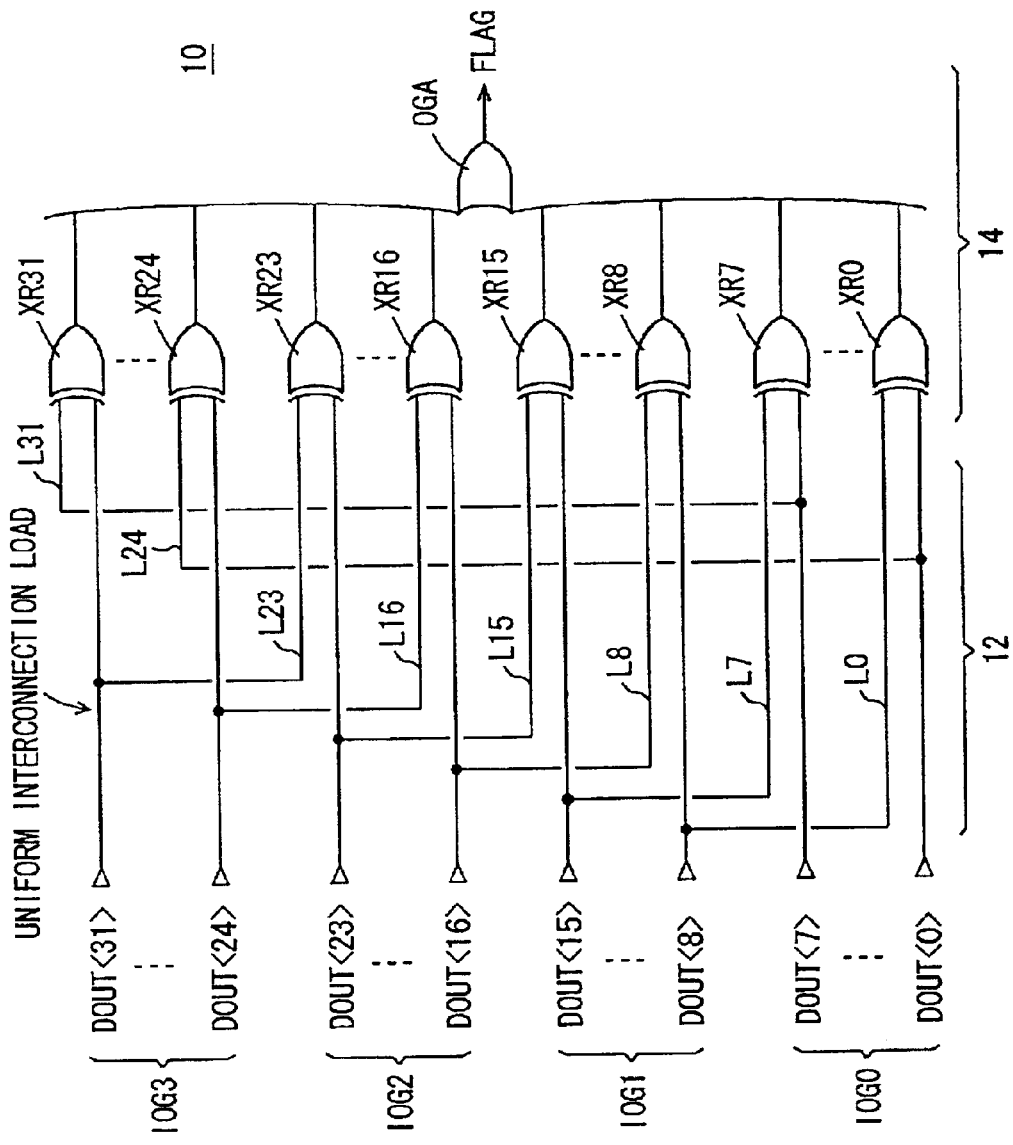
FIG. 3 is a diagram showing the structure of a multi-bit test circuit according to a third embodiment of the present invention.

FIG. 3 schematically shows the structure of multi-bit test circuit 10 according to the third embodiment of the present invention. In multi-bit test circuit 10 shown in FIG. 3, EXOR gates XR24–XR31 are provided corresponding to readout data bits DOUT<24>–DOUT<31>, respectively, in addition to the structure of multi-bit test circuit 10 shown in FIG. 2. As the teacher data bits for readout data bits DOUT<24>–DOUT<31>, readout data bits DOUT<0>–DOUT<7> in data group IOG0 adjacent in the cyclic manner are transmitted to EXOR gates XR24–XR31 via internal interconnection lines L24–L31, respectively.

The output signals of EXOR circuits XR0–XR31 are applied to OR circuit OGA so as to be compressed finally to 1-bit flag FLAG.

The relation between data bits DOUT<23:0> and the teacher data is the same as in the second embodiment, so that the corresponding components are referred to with the same reference numerals, and their detailed description will be omitted.

In the structure of multi-bit test circuit 10 shown in FIG. 3, data bits DOUT<31:0> are supplied with the corresponding data bits in the adjacent data groups (data group IOG3 is adjacent to data group IOG0 in the cyclic manner) as teacher data. Therefore, all of readout data bits DOUT<31:0> are required to drive the input loads of two EXOR circuits, which makes the driving loads on readout data bits DOUT<31:0> approximately uniform. This makes the definite timings of the input signals of EXOR circuits XR0–XR31 approximately the same, thereby making the definite timings of the output signals of EXOR circuits XR0–XR31 approximately the same. As a result, there is no need to determine the timing of taking in flag FLAG from OR circuit OGA with the variations in signal propagation delay time taken into consideration, making it possible for a next stage circuit to take in flag FLAG at a faster timing. This facilitates the timing designing for the next-stage circuit (not shown) to take in flag FLAG from OR circuit OGA.

When any of readout data bits DOUT<31:0> is a defect, out of EXOR circuits XR0–XR31, the output signal of the EXOR circuit corresponding to the defect rises to a high level approximately at the same timing as to all readout data bits DOUT<31:0>. Therefore, flag FLAG changes approximately in the same timing for all readout data bits DOUT<31:0>.

Each of readout data bits DOUT<31:0> is used as teacher data for the corresponding data bit in the adjacent data group. Therefore, even when EXOR circuit XR0 causes a defect of fixing the output signal at a low level, readout data bits DOUT<8> and DOUT<0> are compared with other readout data bits, so as to perform precise multi-bit determining operation. More specifically, readout data bit DOUT<0> is compared with readout data bit DOUT<24> in EXOR circuit XR24, whereas data bit DOUT<8> is compared with data bit DOUT<16> in EXOR circuit XR8. Therefore, when one of data bits DOUT<8> and DOUT<0> is a defect, either EXOR circuit XR8 or XR24 detects the defect, resulting in precise multi-bit determining operation, even if EXOR circuit XR0 or XR8 has the defect of fixing the output signal at a low level.

Each bit of readout data bits DOUT<31:0> is applied to two EXOR circuits each performing comparing operations with a different readout data bit. As a result, even if one of the two EXOR circuits has the defect of fixing its output at a low level, precise multi-bit determining operations can be made, as long as the other EXOR circuit operates properly.

As described above, according to the third embodiment of the present invention, data bits in the corresponding positions in adjacent data groups in the cyclic manner are paired off for comparison, so that all readout data bits have substantially the same driving load (gate input load). This makes the definition timings of the determination results be equal regardless of the position of a defective bit, thereby achieving precise and high-speed multi-bit determining operation. Each readout data bit pair is applied to two EXOR circuits, and even if one of the two EXOR circuits has the defect of fixing its output at a low level, precise multi-bit determining operation can be done as long as the other EXOR circuit operates properly. This back-up determining operation can realize a defect-resistant multi-bit test circuit, and further enhance yield.

Fourth Embodiment

Figure 4:
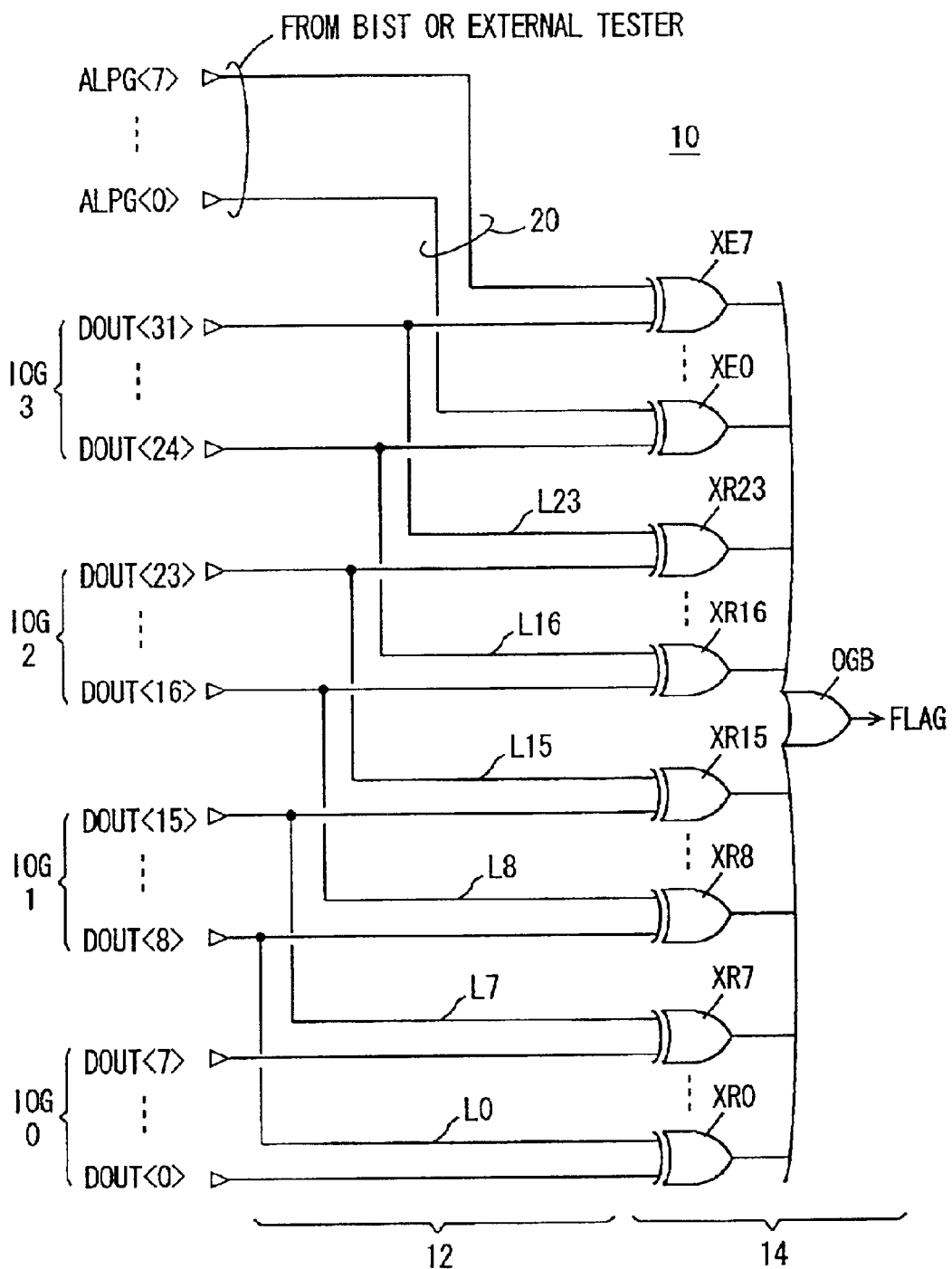
FIG. 4 is a diagram showing the structure of a multi-bit test circuit according to a fourth embodiment of the present invention.

FIG. 4 schematically shows the structure of multi-bit test circuit 10 according to the fourth embodiment of the present invention. Multi-bit test circuit 10 shown in FIG. 4 differs in structure from multi-bit test circuit 10 of the second embodiment shown FIG. 2 in the following points. EXOR circuits XE0–XE7 are provided respectively to readout data bits DOUT<31:24> included in data group IOG3. EXOR circuits XE0–XE7 receive expected value ALPG bits <0:7> at their respective second inputs. The 8-bit expected value ALPG bits <7:0> can be applied from a tester outside the chip where the semiconductor memory device is formed, or can be produced by a BIST (built-in self test) circuit provided on the same chip with the semiconductor memory device.

Expected value ALPG bits <7:0> indicate expected values for the readout data. The multi-bit test circuit shown in FIG. 4 has the same structure as the multi-bit test circuit shown in FIG. 2, and corresponding components are referred to with the same reference numerals, and their detailed description will be omitted.

The output signals of EXOR circuits XR0–XR23 and XE0–XE7 are applied to OR circuit OGB to generate 1-bit flag FLAG.

8-bit expected data ALPG bits <7:0> are transmitted via an expected value data bus 20 and compared with readout data bits DOUT<31:24> in data group IOG3 in EXOR circuits XE7–XE0, respectively. The other data bits DOUT<23:0> are compared with the data bits, used as teacher data, in the corresponding positions in the adjacent data groups. Thus, the use of 8-bit expected value ALPG bits <7:0> makes it possible to write or read an 8-bit expected value pattern in each of data groups IOG3–IOG0. This can set the 8-bit data pattern of each of data groups IOG0–IOG3 to any desired pattern, thereby allowing a wide selection of the contents of multi-bit test to perform more precise multi-bit test.

According to the fourth embodiment of the present invention, multi-bit expected value is used as teacher data, and the expected value data pattern can be compared with readout data bits equivalently in units of data groups, thereby achieving a flexible multi-bit test. The same effects as in the second embodiment can also be provided.

Fifth Embodiment

FIG. 5 shows the structure of multi-bit test circuit 10 according to the fifth embodiment of the present invention. The relation between readout data bits DOUT<31:0> and the corresponding teacher data bits in multi-bit test circuit 10 shown in FIG. 5 is the same as that in multi-bit test circuit 10 shown in FIG. 3. In data bit pair formation interconnection region 12 in multi-bit test circuit 10 shown in FIG. 5, signal interconnection lines LL0–LL23 that carry readout data bits DOUT<8>–DOUT<31> as teacher data and signal interconnection lines L31–L24 that carry data bits DOUT<7:0> as the teacher data bits for readout data bits DOUT<31:24> all have the same interconnection length.

In data bit pair formation interconnection region 12, the signal interconnection lines LL0–LL23 and L24–L31 of the same length equalize not only the gate capacitance but also the interconnection capacitance of data bits DOUT<31:0>, thereby making the signal propagation delay of each of readout data bits DOUT<31:0> substantially the same. Consequently, even if any of the data bits DOUT<31:0> is a defect, flag FLAG can be put into a definite state at substantially the same timing, thereby facilitating the timing design of the circuit to take in flag FLAG.

The signal interconnection lines LL0-LL23 can be laid out merely in a meandering fashion. In order to prevent the signal interconnection lines from being complicated, interconnection lines of a multi-layered structure can be used to lay out each signal interconnection line.

As described above, according to the fifth embodiment, the signal lines that transmit readout data bits to be subjected to a multi-bit test as teacher data bits have the same interconnection length. Consequently, the interconnection loads and gate loads of the readout data bits can be made substantially the same, which prevents variations in the definition timing of determination result. Hence, multi-bit determination can be done at a faster timing. In addition, timing margin for taking in the determination result can be increased, thereby facilitating the timing designing of the circuit to take in the flag indicating the multi-bit determination result.

Sixth Embodiment

Figure 6:
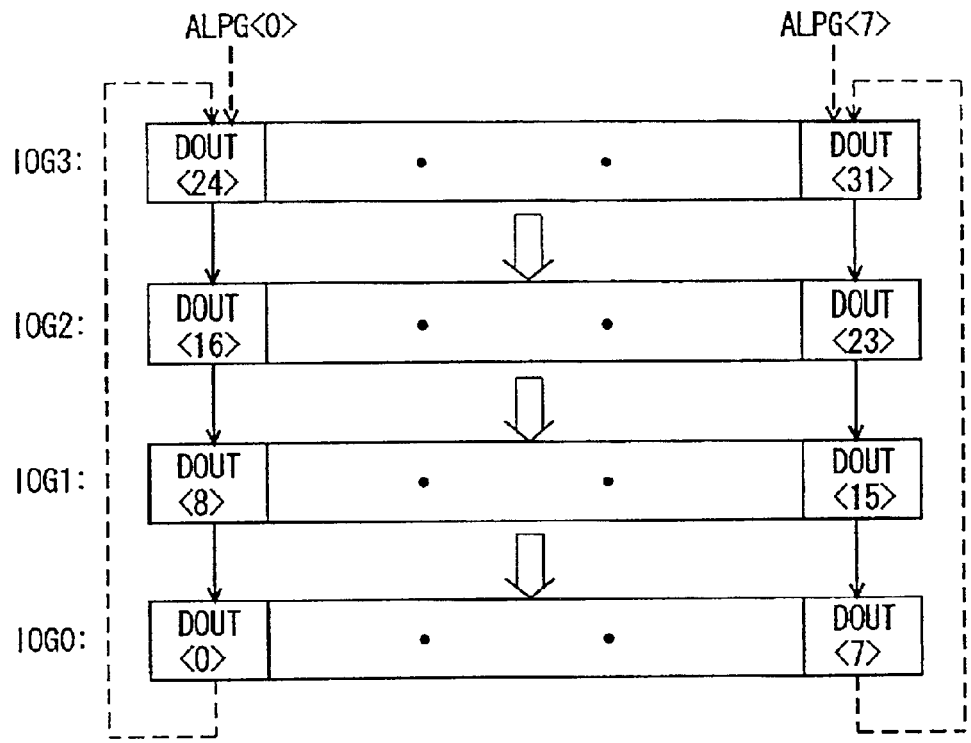
FIG. 6 is a diagram showing the relation between each readout data bit and the corresponding teacher data in the multi-bit test circuit according to the present invention.

FIG. 6 shows the relation between the readout data bits and the teacher data bits in the present invention. As shown in FIG. 6, readout data bits DOUT<31:0> are divided into four data groups IOG3–IOG0 each having 8-bit data. The readout data bits are supplied with the data bits in the corresponding positions in the adjacent data groups as teacher data. In FIG. 6, data bits DOUT<24>–DOUT<31> in data group IOG3 are supplied with either corresponding data bits DOUT<0>–DOUT<7> in data group IOG0 adjacent in the cyclic manner or expected value data bits ALPG<0>–ALPG<7> as teacher data bits.

Data groups IOG3–IOG0 each have 8 bits as shown in FIG. 6 because in an embedded DRAM as an application example of the present invention, defect repairing is performed in units of 8 IO global data line pairs (GIOs). Thus, one spare IO is arranged for 8 IO, and the layout of a circuit is repeated in units of 8 IOs (8-bit data). Therefore, dividing data bits DOUT<31:0> into 8-bit data groups makes EXOR circuits be able to be laid out in the same manner, and circuits connected to the corresponding readout data bits be also able to be laid out through repetition of the same layout.

Besides, the data bits in the same data group could be used as teacher data bits. In other words, the structures of the second thorough fifth embodiments are used for 8-bit data in place of 32-bit data, and the flag outputted from each data group is either further compressed or outputted intactly. In this structure, similar effects can be obtained.

[Modification]

Figure 7:
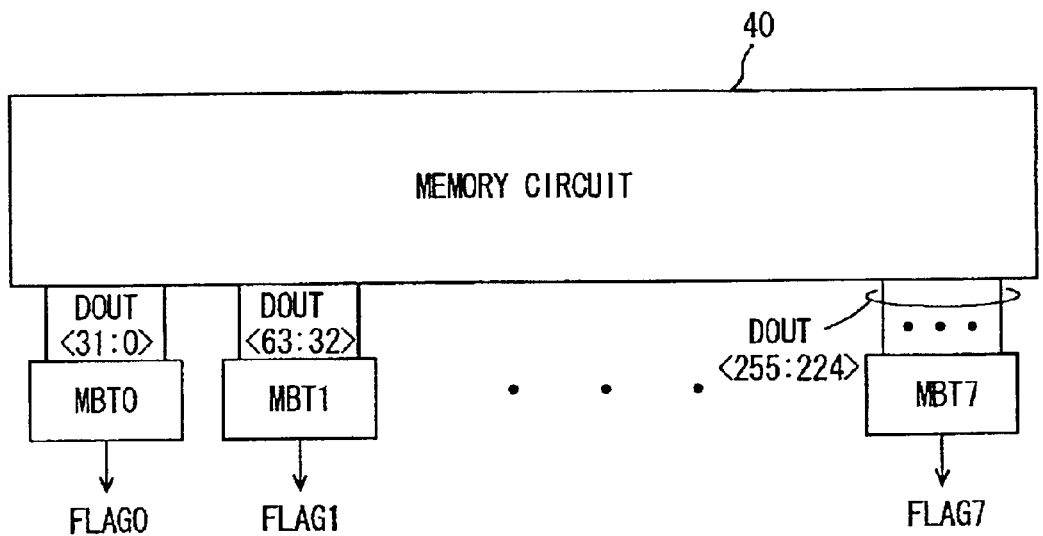
FIG. 7 is a diagram schematically showing another structure of the semiconductor memory device according to the present invention.

FIG. 7 schematically shows a modification of he semiconductor memory device according to the present invention. In FIG. 7, a memory circuit 40 outputs 256-bit data in parallel (via global data line pairs GIO shown in FIG. 1). Memory circuit 40 includes the row/column decoder band, memory array, and internal data readout circuit as shown in FIG. 1. The data bits DOUT<255:0> read out from memory circuit 1 are divided into 32-bit data groups. In each 32-bit data group, multi-bit test circuit MBT shown in the second through fifth embodiments is provided. In FIG. 7, multi-bit test circuits MBT0, MBT1, . . . MBT7 are provided to data bits DOUT<31:0>, DOUT<63:32>, . . . DOUT<255:224>, respectively. Multi-bit test circuits MBT0–MBT7 perform compressing operation in accordance with either structure of the second thorough fifth embodiments, and output flags FLAG0–FLAG7 indicating the multi-bit determination results, respectively. Flags FLAG0–FLAG7 can be outputted in parallel outside the semiconductor memory device (via a specific pad or a specific output circuit). Besides, further compressing operation may be performed to generate a 1-bit final flag.

As shown in FIG. 7, designing the multi-bit test circuit for a 32-bit data group in accordance with either one of the second through fifth embodiments makes it possible to cope with the expansion of the data bit width in memory circuit 1 only by increasing the number of the multi-bit test circuits. A multi-bit determining operation is executed for each 32 IOs. Even when memory circuit 1 is subject to a data bit width expansion of readout data in units of 32 bits, a circuit which performs precise and high-speed multi-bit determining operation with a small occupation area can be implemented by using the multi-bit test circuit of any of the second through fifth embodiments, The second through fifth embodiments show, as circuits each generating flag FLAG indicating the final determination result, a single stage OR circuits OG, OGA and OGB. Alternatively, an OR circuit to generate a flag indicating the final determination result may be composed of a multi-stage gate circuit which performs compressing operation to reduce successively the number of bits outputted over the multi stages, to finally generate 1-bit flag.

In the same manner as an address decode circuit, the following structure may be employed: MOS transistors (insulated gate type field effect transistors) which receive the output signals of EXOR circuits at their gates are connected in parallel to an output node. When any of the output signals of EXOR circuits is at a high level, the corresponding MOS transistor is rendered conductive, and the output node is discharged to the ground levels. The final 1-bit flag is generated by inverting the voltage at the output node. The above alternative arrangement may be employed for the OR circuit for generating a flag FLAG to indicate the final determination result.

In the above description, an embedded DRAM is described as an example of the semiconductor memory device. However, the present invention can be applied to a semiconductor memory device where 32-bit data are read out internally and 8-bit data is outputted through 32 to 8 selection or 4 to 1 selection operation. Besides DRAMs, the semiconductor memory device can be a static random access memory, and the present invention can be applied, as long as the semiconductor memory device in which a multi-bit test is performed by using teacher data.

As described above, according to the present invention, internal readout data bits are divided into a plurality of groups and a data bit in a corresponding position in a different group is used as teacher data to perform multi-bit determination. This eliminates the need of the propagation of the teacher data over a long distance, thereby achieving a multi-bit test circuit capable of high-speed, precise multi-bit determination with a small layout area.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A multi-bit test circuit for determining a match in logical level among a plurality of data bits read out in parallel from a memory array, comprising:

a plurality of first determining circuits, arranged corresponding to said plurality of data bits, each for receiving, as a pair, a corresponding data bit and a teacher data bit placed in a predetermined relation with said corresponding data bit in the plurality of data bits, and determining a match in logical level between received data bits, data bits in each pair including different teacher data bits from other pair(s), said plurality of data bits being divided into at least three groups, and the first determining circuits being arranged such that a data bit in a group of said at least three groups is compared with a data bit in each of other two groups, and the number of said plurality of first determining circuits being the same as the number of said plurality of data bits; and a final determining circuit for outputting a final determination signal indicating a match in logical level among said plurality of data bits in accordance with output signals of said plurality of first determining circuits.

2. The multi-bit test circuit according to claim 1, wherein said plurality of data bits are divided into a plurality of groups each having a predetermined number of data bits, and each of said plurality of first determining circuits receives, as a teacher data bit thereof, a data bit in a different group from a corresponding group including a corresponding data bit and in a same position in the different group as a position of the corresponding data bit in the corresponding group.

3. The multi-bit test circuit according to claim 1, wherein said plurality of data bits are applied in parallel, and divided into a plurality of groups each having a same data width, and each of said plurality of first determining circuits receives, as said teacher data bit, a data bit that is in a group adjacent to a corresponding group including a corresponding data bit and in a corresponding position in the adjacent group to a position of the corresponding data bit in the corresponding group.

4. The multi-bit test circuit according to claim 3, wherein each of said plurality of first determining circuits receives, as said teacher data bit, a data bit in a corresponding position, to a position of a corresponding data bit, in a group adjacent in cyclic manner among said plurality of groups.

5. The multi-bit test circuit according to claim 1, wherein said plurality of data bits are applied in parallel, and divided into a plurality of groups having a same bit width; and said plurality of first determining circuits are arranged corresponding to said plurality of data bits, respectively, and receive, as teacher data bits, data bits in corresponding positions, in groups different from the groups of corresponding data bits.

6. The multi-bit test circuit according to claim 1, wherein said plurality of data bits are applied in parallel, and are divided into a plurality of groups of a same bit width, and said plurality of first determination circuits comprise a plurality of gate circuits, arranged corresponding to respective data bits of a predetermined number of groups of said plurality of groups, each for receiving a corresponding data bit and the teacher data bit represented by a data bit located in a corresponding position in a different group from a corresponding group including the corresponding data, and determining a match in logic level between the corresponding data bit and the received teacher data bit.

7. The multi-bit test circuit according to claim 1, further comprising a teacher signal transmission bus for transmitting expected value teacher data of plural bits, wherein said plurality of data bits are applied in parallel, and divided into a plurality of groups each having a predetermined number of data bits; and said teacher signal transmission bus has a same bit width as the groups of the data bits, and said plurality of first determining circuits comprises:

a plurality of first determination gates, arranged corresponding to respective data bits in a predetermined number of groups of said plurality of groups of data bits, each receiving a corresponding data bit and a data bit in a corresponding position in a group different from a group including the corresponding data bit as said teacher data bits; and a plurality of second determination gates, arranged corresponding to the respective data bits in other groups, each receiving a corresponding data bit in a corresponding group and a corresponding expected value teacher data bit of said expected value teacher data of plural bits.

8. The multi-bit test circuit according to claim 1, wherein each of the data bits is received by the same number of the first determining circuits.

9. The multi-bit test circuit according to claim 1, wherein an interconnection layout of each data bit to a corresponding first determining circuit is so set that interconnection loads of all the data bits are substantially the same with each other.

* * * * *